United States Patent
Asao

(10) Patent No.: US 7,965,542 B2
(45) Date of Patent: Jun. 21, 2011

(54) MAGNETIC RANDOM ACCESS MEMORY AND WRITE METHOD OF THE SAME

(75) Inventor: Yoshiaki Asao, Sagamihara (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 827 days.

(21) Appl. No.: 12/015,015

(22) Filed: Jan. 16, 2008

(65) Prior Publication Data

US 2008/0170432 A1 Jul. 17, 2008

(30) Foreign Application Priority Data

Jan. 17, 2007 (JP) .................................. 2007-008078

(51) Int. Cl.
*G11C 11/00* (2006.01)

(52) U.S. Cl. ......... 365/158; 365/148; 365/171; 977/935

(58) Field of Classification Search ............... 365/48, 365/55, 62, 66, 74, 78, 80–93, 100, 130, 365/131, 148, 158, 171–173, 209, 213, 225.5, 365/230.07, 232, 243.5; 216/22; 257/421, 257/E21.665; 438/3; 428/810–816, 817–825.1, 428/826; 977/933–935

See application file for complete search history.

(56) References Cited

U.S. PATENT DOCUMENTS

| | | | |
|---|---|---|---|
| 7,079,414 B2 * | 7/2006 | Iwata et al. .................... | 365/158 |
| 7,106,624 B2 | 9/2006 | Huai et al. | |
| 7,110,284 B2 | 9/2006 | Hayakawa et al. | |
| 7,209,378 B2 * | 4/2007 | Nejad et al. .................... | 365/148 |
| 7,251,154 B2 * | 7/2007 | Hush .............................. | 365/148 |
| 7,558,103 B2 * | 7/2009 | Nakamura et al. ............. | 365/151 |
| 7,668,000 B2 * | 2/2010 | Hush .............................. | 365/148 |
| 2004/0252551 A1 * | 12/2004 | Iwata et al. ..................... | 365/158 |
| 2005/0117392 A1 * | 6/2005 | Hayakawa et al. ............ | 365/171 |
| 2005/0201023 A1 * | 9/2005 | Huai et al. ................. | 360/324.11 |
| 2007/0057278 A1 * | 3/2007 | Nakamura et al. ............. | 257/107 |
| 2007/0211525 A1 * | 9/2007 | Nakamura et al. ............. | 365/164 |
| 2009/0046501 A1 * | 2/2009 | Ranjan et al. .................. | 365/171 |
| 2010/0073025 A1 * | 3/2010 | Tanamoto et al. ............... | 326/41 |
| 2010/0091546 A1 * | 4/2010 | Liu et al. .......................... | 365/97 |

OTHER PUBLICATIONS

M. Hosomi, et al. "A Novel Nonvolatile Memory with Spin Torque Transfer Magnetization Switching: Spin-RAM" IEEE, 2005, 4 Pages.

J. C. Slonczewski, "Current-driven excitation of magnetic multilayers", Journal of Magnetism and Magnetic Materials 159, 1996, pp. L1-L7.

* cited by examiner

*Primary Examiner* — VanThu Nguyen
*Assistant Examiner* — Harry W Byrne
(74) *Attorney, Agent, or Firm* — Oblon, Spivak, McClelland, Maier & Neustadt, L.L.P.

(57) ABSTRACT

A magnetic random access memory includes a memory cell element which includes a first fixed layer, a first recording layer in which a magnetization direction reverses on the basis of a first threshold value, and a first nonmagnetic layer formed between the first fixed layer and the first recording layer, a first interconnection connected to one terminal of the memory cell element, a transistor whose current path has one end connected to the other terminal of the memory cell element, a second interconnection connected to the other end of the current path, and a first resistance change element electrically connected to the memory cell element, and having a resistance value which changes on the basis of a second threshold value.

20 Claims, 16 Drawing Sheets

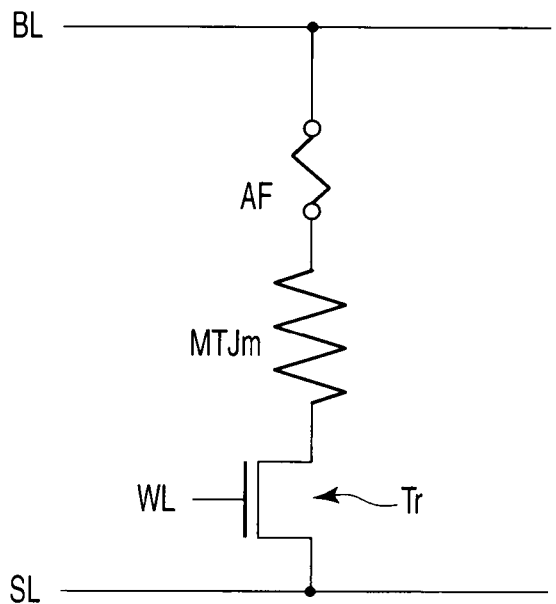
F I G. 1
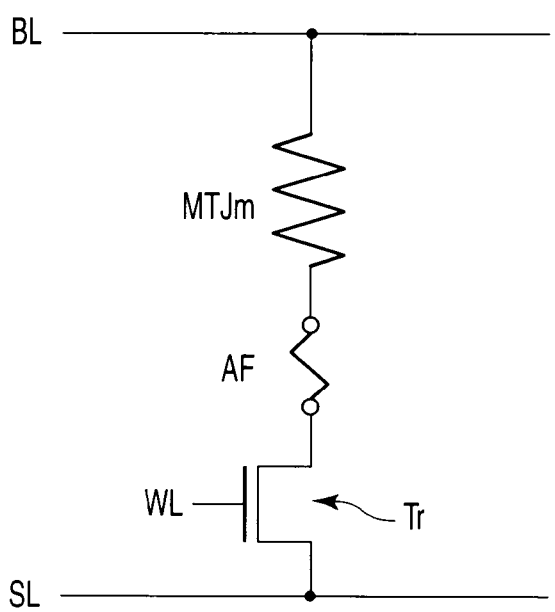
F I G. 3

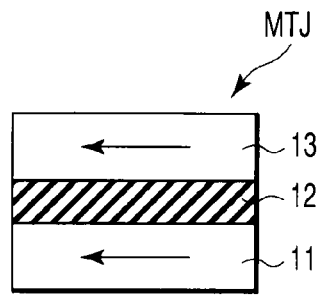
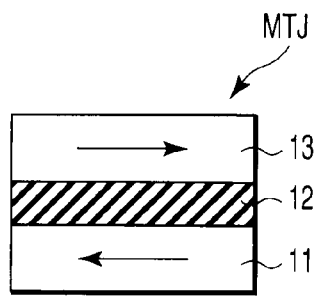
FIG. 4A — Parallel (low resistance)
FIG. 4B — Antiparallel (high resistance)
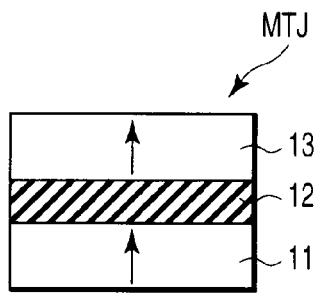
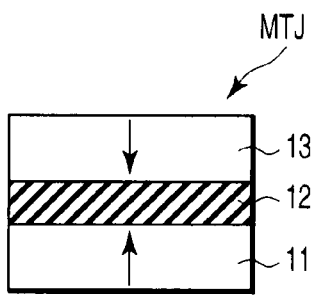
FIG. 5A — Parallel (low resistance)
FIG. 5B — Antiparallel (high resistance)
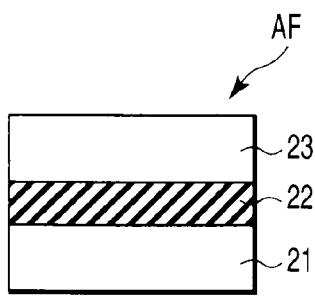
FIG. 6

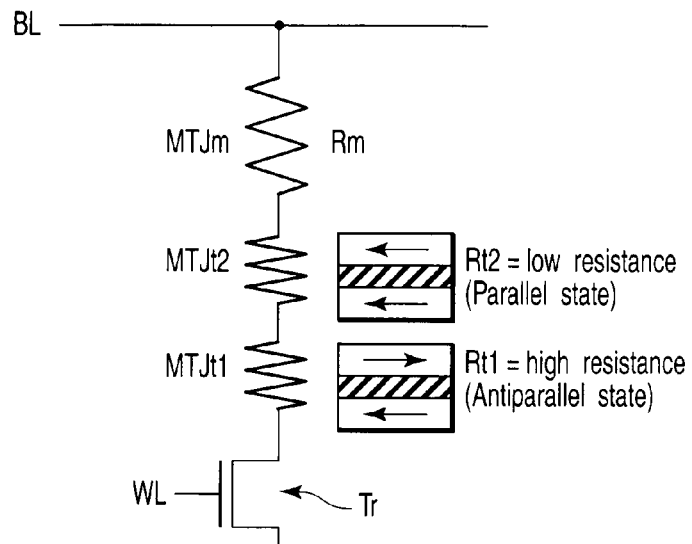
F I G. 17
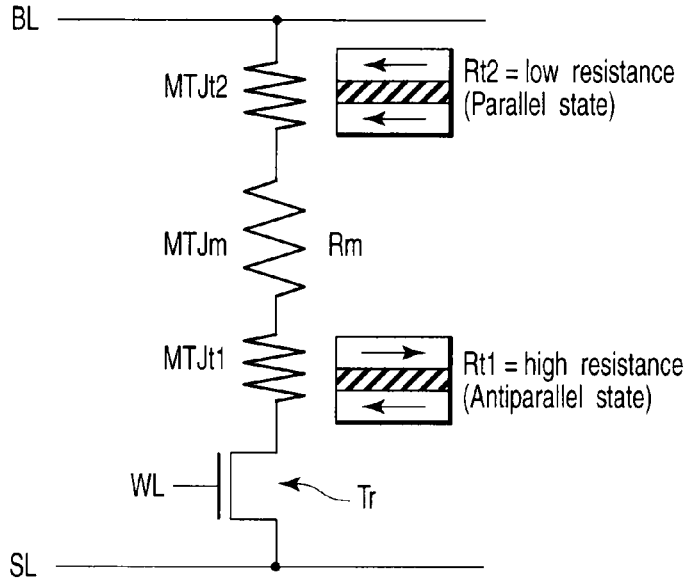
F I G. 18
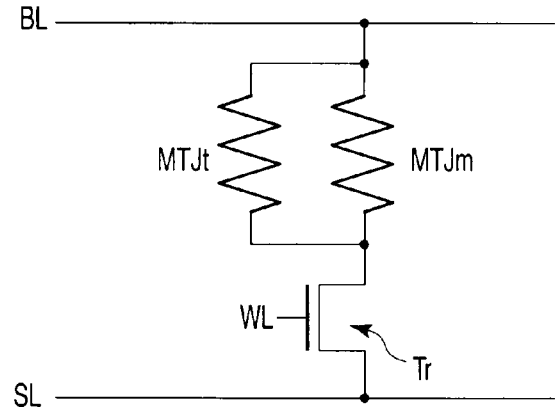
F I G. 19

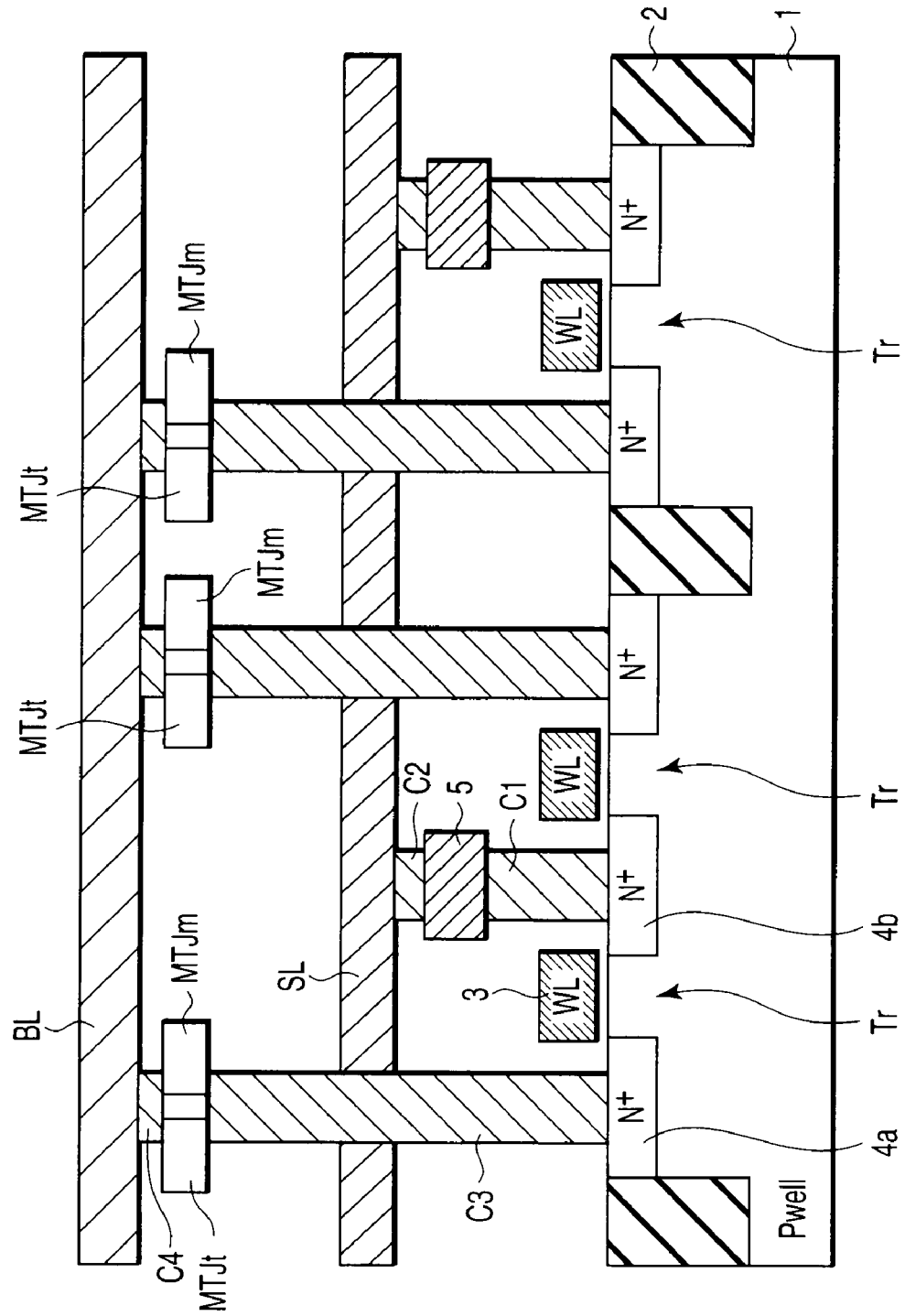
F I G. 20

MAGNETIC RANDOM ACCESS MEMORY AND WRITE METHOD OF THE SAME

CROSS-REFERENCE TO RELATED APPLICATIONS

This application is based upon and claims the benefit of priority from prior Japanese Patent Application No. 2007-008078, filed Jan. 17, 2007, the entire contents of which are incorporated herein by reference.

BACKGROUND OF THE INVENTION

1. Field of the Invention

The present invention relates to a spin injection magnetization reversal type magnetic random access memory (MRAM).

2. Description of the Related Art

Recently, a spin injection magnetization reversal type magnetic random access memory (e.g., non-patent reference 1) is proposed as a magnetic random access memory (MRAM). A cell of this magnetic random access memory comprises an MTJ (Magnetic Tunnel Junction) element and switching transistor. In a write operation using the spin injection magnetization reversing technique, an electric current is supplied perpendicularly to the film surface of the MTJ element, and the magnetization direction in a recording layer is changed by the direction of this electric current.

Unfortunately, the reversing current threshold value sometimes varies from one MTJ element to another, and the write characteristics deteriorate in this case.

[Non-patent Reference 1] IEDM2005 Technical Digest p. 473-476 "A Novel Nonvolatile Memory with Spin Torque Transfer Magnetization Switching: Spin-RAM" or J. of Magn. Magn. Mater., 159, L1 (1996) "Current-driven excitation of magnetic multilayers"

BRIEF SUMMARY OF THE INVENTION

A magnetic random access memory according to the first aspect of the present invention comprising a memory cell element which includes a first fixed layer in which a magnetization direction is fixed, a first recording layer in which a magnetization direction reverses on the basis of a first threshold value, and a first nonmagnetic layer formed between the first fixed layer and the first recording layer, and in which the magnetization directions in the first fixed layer and the first recording layer take one of a parallel state and an antiparallel state in accordance with a direction of an electric current flowing between the first fixed layer and the first recording layer, a first interconnection connected to one terminal of the memory cell element, a transistor whose current path has one end connected to the other terminal of the memory cell element, a second interconnection connected to the other end of the current path, and a first resistance change element electrically connected to the memory cell element, and having a resistance value which changes on the basis of a second threshold value different from the first threshold value.

A write method of a magnetic random access memory according to the second aspect of the present invention comprising a memory cell element which includes a first fixed layer in which a magnetization direction is fixed, a first recording layer in which a magnetization direction reverses on the basis of a first threshold value, and a first nonmagnetic layer formed between the first fixed layer and the first recording layer, and in which the magnetization directions in the first fixed layer and the first recording layer take one of a parallel state and an antiparallel state in accordance with a direction of an electric current flowing between the first fixed layer and the first recording layer, a first interconnection connected to one terminal of the memory cell element, a transistor whose current path has one end connected to the other terminal of the memory cell element, a second interconnection connected to the other end of the current path, and a first resistance change element electrically connected to the memory cell element, and having a resistance value which changes on the basis of a second threshold value different from the first threshold value, wherein when writing data in the memory cell element by supplying a write current perpendicularly to a film surface of the memory cell element, a value of an electric current flowing through the memory cell element is changed by changing the resistance value of the first resistance change element by the write current, supplying an electric current exceeding the first threshold value to the memory cell element.

BRIEF DESCRIPTION OF THE SEVERAL VIEWS OF THE DRAWING

FIG. 1 is a circuit diagram showing a memory cell of a magnetic random access memory according to the first embodiment of the present invention;

FIG. 3 is a circuit diagram showing another memory cell of the magnetic random access memory according to the first embodiment of the present invention;

FIGS. 4A and 4B are sectional views showing a parallel magnetization type MTJ element according to the first embodiment of the present invention;

FIGS. 5A and 5B are sectional views of a perpendicular magnetization type MTJ element according to the first embodiment of the present invention;

FIG. 6 is a sectional view of an anti-fuse element according to the first embodiment of the present invention;

FIG. 17 is a circuit diagram showing another memory cell of the magnetic random access memory according to the third embodiment of the present invention;

FIG. 18 is a circuit diagram showing still another memory cell of the magnetic random access memory according to the third embodiment of the present invention;

FIG. 19 is a circuit diagram showing a memory cell of a magnetic random access memory according to the fourth embodiment of the present invention;

FIG. 20 is a sectional view showing the memory cell of the magnetic random access memory according to the fourth embodiment of the present invention;

DETAILED DESCRIPTION OF THE INVENTION

Figure 2:
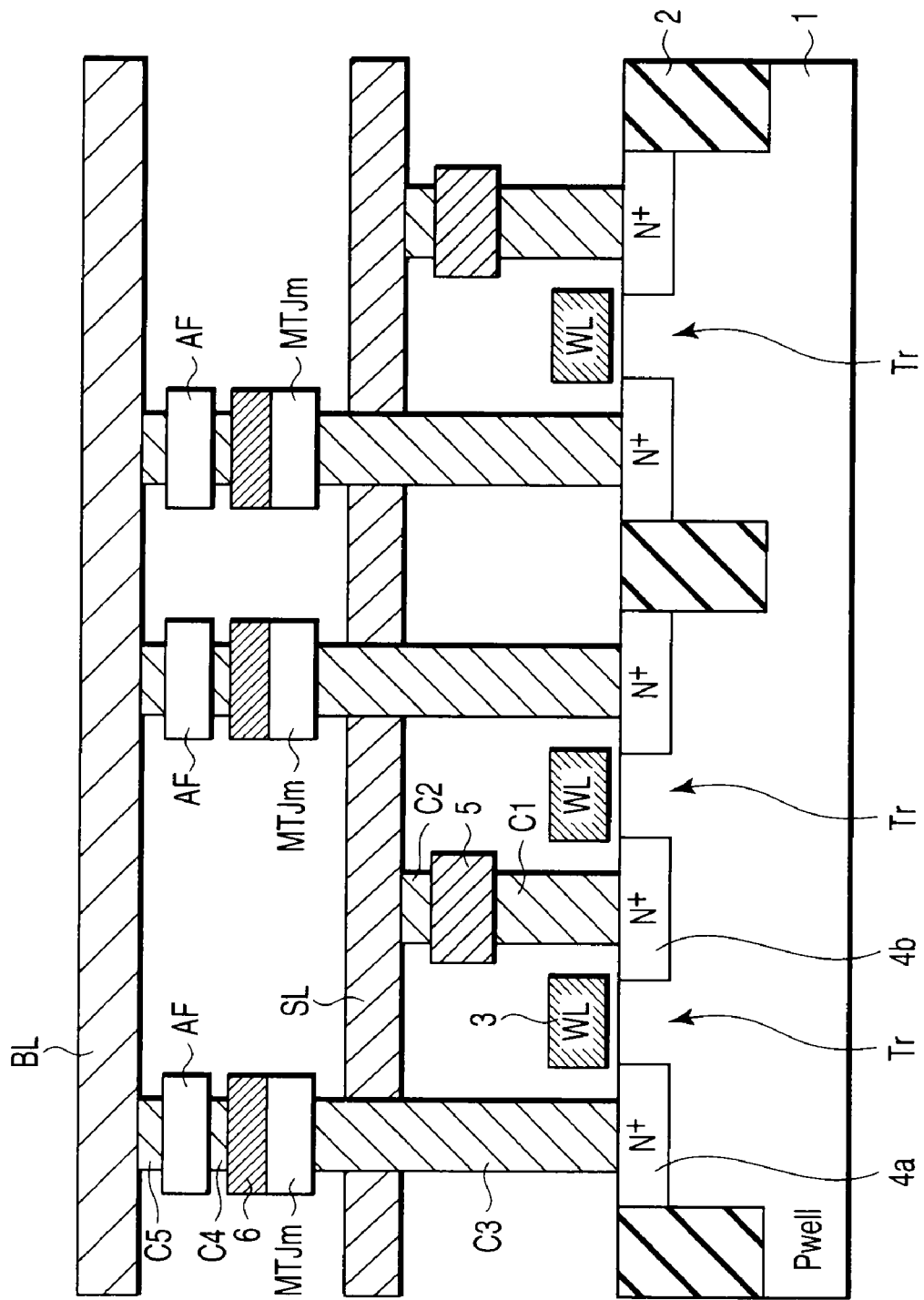
FIG. 2 is a sectional view showing the memory cell of the magnetic random access memory according to the first embodiment of the present invention.

Embodiments of the present invention will be explained below with reference to the accompanying drawing. In the following explanation, the same reference numerals denote the same parts throughout the drawing.

[1] First Embodiment

The first embodiment uses an anti-fuse element as a resistance change element connected to a memory cell element to make a pair.

[1-1] Structure

FIGS. 1 and 3 are circuit diagrams of memory cells of a magnetic random access memory according to the first embodiment of the present invention. FIG. 2 is a sectional view of a memory cell of the magnetic random access memory according to the first embodiment of the present invention. The memory cells of the magnetic random access memory according to the first embodiment will be explained below.

As shown in FIG. 1, the memory cell has an MTJ element MTJm functioning as a memory cell element. A bit line BL is connected to one terminal of the MTJ element MTJm. One end of the current path of a transistor Tr is connected to the other terminal of the MTJ element MTJm. A source line SL is connected to the other end of the current path of the transistor Tr. A word line WL is connected to the gate of the transistor Tr.

An anti-fuse element AF functioning as a resistance change element is connected to one terminal of the MTJ element MTJm and the bit line BL. The anti-fuse element AF is paired with the MTJ element MTJm, and connected in series with the MTJ element MTJm.

FIG. 2 shows an example of the sectional structure of the circuit configuration shown in FIG. 1. As shown in FIG. 2, an element isolation region 2 having an STI (Shallow Trench Isolation) structure is formed in a semiconductor substrate (silicon substrate) 1. A gate electrode 3 is formed on a gate insulating film (not shown) on the semiconductor substrate 1. Source/drain diffusion layers 4a and 4b are formed in the semiconductor substrate 1 on the two sides of the gate electrode 3. In this manner, a transistor (e.g., a MOS transistor) Tr functioning as a switching element is formed.

A contact C3 is connected to the source/drain diffusion layer 4a of the transistor Tr. The MTJ element MTJm is formed on the contact C3. An upper electrode 6 is formed on the MTJ element MTJm. A contact C4 is connected to the upper electrode 6. The anti-fuse element AF is formed on the contact C4, and connected to the bit line BL via a contact C5. The bit line BL is connected to, e.g., a power supply terminal or ground terminal.

A contact C1 is connected to the source/drain diffusion layer 4b of the transistor Tr. An interconnection 5 is formed on the contact C1, and connected to the source line SL via a contact C2. The source line SL is connected to, e.g., a power supply terminal or ground terminal.

Note that as shown in FIG. 3, the anti-fuse element AF may also be connected to the MTJ element MTJm and transistor Tr, and may also be connected in parallel to the MTJ element MTJm. In these structures, two or more anti-fuse elements AF may also be formed.

[1-2] MTJ Element

FIGS. 4A and 4B are sectional views of a parallel magnetization type MTJ element according to the first embodiment of the present invention. FIGS. 5A and 5B are sectional views of a perpendicular magnetization type MTJ element according to the first embodiment of the present invention. The MTJ elements according to the first embodiment will be explained below.

As shown in FIGS. 4A, 4B, 5A, and 5B, an MTJ element MTJ has a fixed layer (pinned layer) 11 in which the magnetization direction is fixed, a recording layer (free layer) 13 in which the magnetization direction can reverse, and a nonmagnetic layer 12 formed between the fixed layer 11 and recording layer 13.

In the MTJ element MTJ as described above, the magnetization directions in the fixed layer 11 and recording layer 13 take a parallel state or antiparallel state in accordance with the direction of an electric current flowing between the fixed layer 11 and recording layer 13. The magnetization in the recording layer 13 reverses when an electric current exceeding the reversing current threshold value flows.

As shown in FIGS. 4A and 4B, the magnetization directions in the fixed layer 11 and recording layer 13 of the MTJ element MTJ can be parallel to the film surface (a parallel magnetization type). Alternatively, as shown in FIGS. 5A and 5B, the magnetization directions in the fixed layer 11 and recording layer 13 of the MTJ element MTJ can be perpendicular to the film surface (a perpendicular magnetization type). Note that the perpendicular magnetization type MTJ element MTJ has the advantage that the longitudinal direction of the element shape does not determine the magnetization direction any longer.

Examples of the materials of the MTJ element MTJ are as follows.

As the material of the fixed layer 11 and recording layer 13, it is favorable to use any of Fe, Co, Ni, alloys of these metals, magnetite having a high spin polarization ratio, oxides such as $CrO_2$ and $RXMnO_{3-y}$ (R; a rare earth element, and X; Ca, Ba, or Sr), and Heusler alloys such as NiMnSb and PtMnSb. These magnetic materials may also contain more or less nonmagnetic elements such as Ag, Cu, Au, Al, Mg, Si, Bi, Ta, B, C, O, N, Pd, Pt, Zr, Ir, W, Mo, and Nb, provided that the materials do not lose their ferromagnetism.

As the material of the nonmagnetic layer 12, it is possible to use any of various dielectric materials such as $Al_2O_3$, $SiO_2$, MgO, AlN, $Bi_2O_3$, $MgF_2$, $CaF_2$, $SrTiO_2$, and $AlLaO_3$. Oxygen, nitrogen, and fluorine deficiencies may exist in these dielectric materials.

An antiferromagnetic layer for fixing the magnetization direction in the fixed layer 11 may also be formed on the surface of the fixed layer 11 away from the nonmagnetic layer 12. As the material of this antiferromagnetic layer, it is possible to use, e.g., Fe—Mn, Pt—Mn, Pt—Cr—Mn, Ni—Mn, Ir—Mn, NiO, or $Fe_2O_3$.

The planar shape of the MTJ element MTJ can be changed to, e.g., a rectangle, square, circle, ellipse, hexagon, rhomb, parallelogram, cross, or bean (recessed shape).

The MTJ element MTJ can have a single-tunnel-junction (single-junction) structure or double-tunnel-junction (double-junction) structure.

As shown in FIGS. 4A, 4B, 5A, and 5B, a single-tunnel-junction MTJ element MTJ has the fixed layer 11, the recording layer 13, and the nonmagnetic layer 12 formed between the fixed layer 11 and recording layer 13. That is, the MTJ element MTJ has one nonmagnetic layer.

A double-tunnel-junction MTJ element MTJ has a first fixed layer, a second fixed layer, a recording layer formed between the first and second fixed layers, a first nonmagnetic layer formed between the first fixed layer and recording layer, and a second nonmagnetic layer formed between the second fixed layer and recording layer. That is, the MTJ element MTJ has two nonmagnetic layers.

The MR (Magneto Resistive) ratio (the change ratio of the resistance of a state "1" to that of a state "0") of the double-tunnel-junction structure deteriorates less than that of the single-tunnel-junction structure when the same external bias is applied, so the double-tunnel-junction structure can operate with a bias higher than that of the single-tunnel-junction structure. That is, the double-tunnel-junction structure is advantageous when reading out information from a cell.

[1-3] Anti-Fuse Element

FIG. 6 is a sectional view of the anti-fuse element according to the first embodiment of the present invention. The anti-fuse element according to the first embodiment will be explained below.

As shown in FIG. 6, the anti-fuse element AF is, e.g., a capacitor element. This capacitor element has a first conductive layer 21, a second conductive layer 23, and an insulating layer 22 formed between the first and second conductive layers 21 and 23. The first conductive layer 21 is connected to the MTJ element MTJm. The second conductive layer 23 is connected to the bit line BL.

Note that the anti-fuse element AF may also be formed by an insulating layer such as a gate insulating film.

The threshold value of the anti-fuse element AF as described above is set different from the reversing current threshold value of the MTJ element MTJm. For example, the electrostatic breakdown voltage value at which the anti-fuse element AF shorts is set lower than the reversing current threshold value of the MTJ element MTJm. Therefore, the resistance value of the anti-fuse element AF is decreased by shorting the anti-fuse element AF pared with the MTJ element MTJm having a large switching current, thereby increasing the value of an electric current flowing through the MTJ element MTJm.

[1-4] Write Method

Figure 7A:
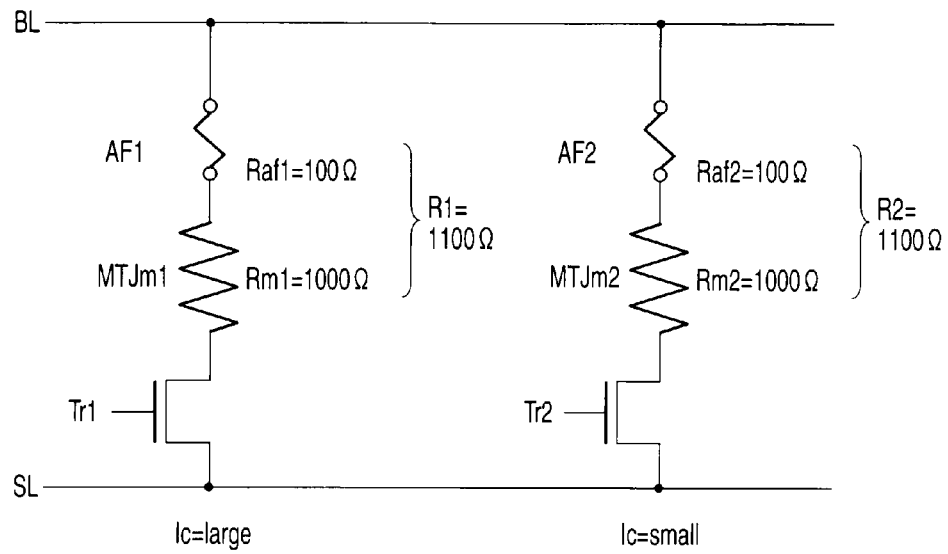
FIGS. 7A and 7B are schematic views for explaining the write method of the magnetic random access memory according to the first embodiment of the present invention.
Figure 7B:
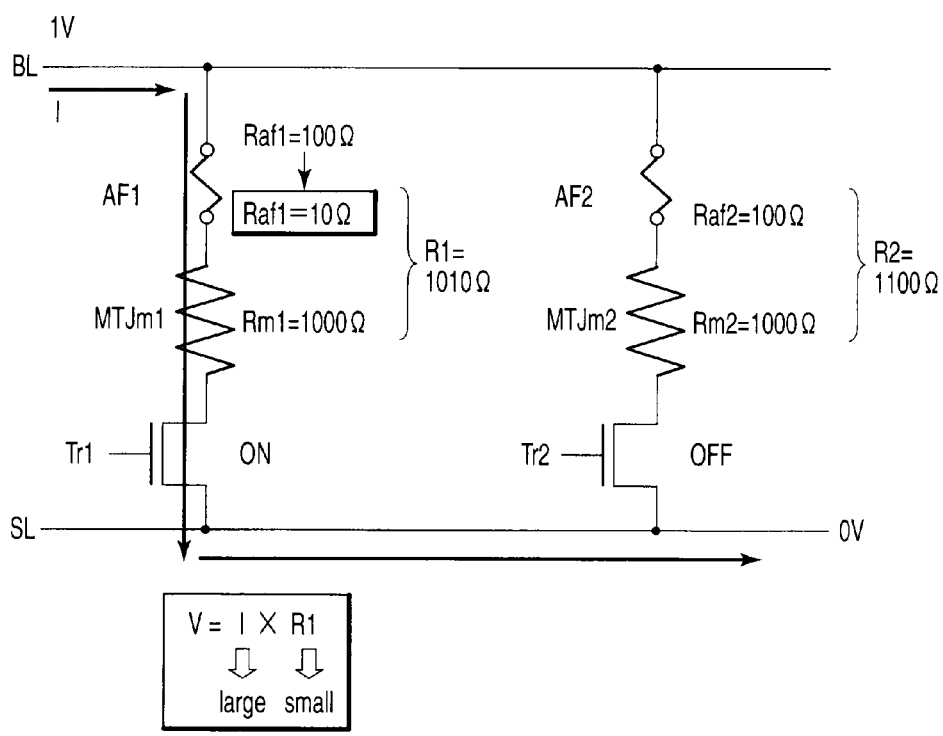
Figure 8:
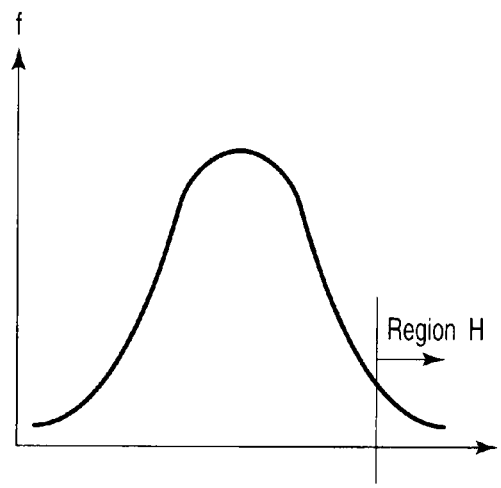
FIG. 8 is a graph showing the waveform of a magnetization reversing current $I_C$ of the MTJ element according to the first embodiment of the present invention.

FIGS. 7A and 7B are schematic views for explaining the magnetic random access memory according to the first embodiment of the present invention. FIG. 8 is a graph showing the waveform of a magnetization reversing current $I_C$ of the MTJ element according to the first embodiment of the present invention. The write method according to the first embodiment will be explained below.

The magnetic random access memory according to the first embodiment writes data by using spin injection magnetization reversal. In the MTJ element MTJm, therefore, the magnetization directions in the fixed layer 11 and recording layer 13 become parallel or antiparallel in accordance with the direction of an electric current I flowing between the fixed layer 11 and recording layer 13. Practical principles are as follows.

When writing data "1", the electric current I is supplied from the fixed layer 11 to the recording layer 13 of the MTJ element MTJ. That is, electrons e are injected from the recording layer 13 to the fixed layer 11. This makes the magnetization directions in the fixed layer 11 and recording layer 13 opposite and antiparallel. A high-resistance state Rap like this is defined as data "1".

On the other hand, when writing data "0", the electric current I is supplied from the recording layer 13 to the fixed layer 11 of the MTJ element MTJ. That is, the electrons e are injected from the fixed layer 11 to the recording layer 13. This makes the magnetization directions in the fixed layer 11 and recording layer 13 equal and parallel. A low-resistance state Rp like this is defined as data "0".

When performing the write operation using the spin injection magnetization reversing technique as described above, the operation of this embodiment in which the anti-fuse element AF is formed in the memory cell is as follows.

FIG. 7A shows the initial state. As shown in FIG. 7A, assume that the memory cell array includes an MTJ element MTJm1 having a large magnetization reversing current $I_C$ (reversing current threshold value) and an MTJ element MTJm2 having a small magnetization reversing current $I_C$. The MTJ element MTJm1 having the large magnetization reversing current $I_C$ is an element existing in a region H of FIG. 8, in which the magnetization in the recording layer does not reverse unless the write current increases. In the initial state, a resistance value Rm1 of the MTJ element MTJm1 having the large magnetization reversing current $I_C$ is, e.g., 1,000Ω, and a resistance value Raf1 of an anti-fuse element AF1 is e.g., 100Ω. Accordingly, a series resistance R1 of this memory cell is 1,100Ω.

FIG. 7B shows the case where data is read out from the memory cell in the initial state shown in FIG. 7A. When reading out the data, the source line SL is set at 0 V by, e.g., applying a voltage of 1 V to the bit line BL. Then, the write current I is supplied to the MTJ element MTJm1 to reverse the magnetization in the recording layer.

In this case, the write current I also flows through the anti-fuse element AF1. When a voltage higher than the electrostatic breakdown voltage is applied, the electric current I flowing through the anti-fuse element AF1 breaks it and shorts it. As a consequence, the resistance value Raf1 of the anti-fuse element AF1 decreases to, e.g., 10Ω. Accordingly, the resistance value R1 of the whole cell also decreases to 1,010Ω. Since the voltage of the circuit is constant and the resistance value R1 has decreased, therefore, the write current I flowing through the MTJ element MTJm1 increases in accordance with the relationship of V=I×R1. Hence, even when the magnetization reversing current $I_C$ of the MTJ element MTJm1 is large, the magnetization in the recording layer can be reversed because the write current I practically having a large current value flows through the MTJ element MTJm1.

As described above, even when the magnetization reversing current $I_C$ of the MTJ element MTJm varies from one memory cell to another, it is possible to decrease the resistance of the anti-fuse element AF1 by supplying the write current I larger than the electrostatic breakdown voltage, thereby increasing the value of an electric current flowing through the MTJ element MTJm1. This makes it possible to cause magnetization reversal in the MTJ element MTJm1 having the large magnetization reversing current $I_C$ by using a normal write current value.

[1-5] Read Method

The read operation of the magnetic random access memory according to the first embodiment uses the magnetoresistive effect.

The transistor Tr connected to the MTJ element MTJm of a selected cell is turned on to supply a read current from, e.g., the bit line BL to the source line SL through the MTJ element MTJm. Whether data is "1" or "0" is discriminated by the resistance value of the MTJ element MTJm read out on the basis of this read current.

As shown in FIGS. 4A and 5A, the resistance value of the MTJ element MTJ is small when the magnetization directions in the fixed layer 11 and recording layer 13 take the parallel state Rp. Accordingly, data is "0" in the low-resistance state Rp like this.

On the other hand, as shown in FIGS. 4B and 5B, the resistance value of the MTJ element MTJ is large when the magnetization directions in the fixed layer 11 and recording layer 13 take the antiparallel state Rap. Accordingly, data is "1" in the high-resistance state Rap like this.

Note that the read operation can be performed by reading out a current value by applying a constant voltage, or reading out a voltage value by supplying a constant electric current.

[1-6] Effect

In the first embodiment described above, the anti-fuse element AF is electrically connected to the MTJ element MTJm, and shorted by supplying a write current larger than the electrostatic breakdown voltage value to the anti-fuse element AF. Consequently, the resistance of the anti-fuse element AF decreases, and the value of an electric current flowing through the MTJ element MTJm increases. Even when an MTJ element MTJm having a large magnetization reversing current $I_C$ exists, therefore, an electric current necessary for magnetization reversal can be supplied to the MTJ element MTJm. This makes it possible to improve the write characteristics.

[2] Second Embodiment

The second embodiment uses an MTJ element for trimming as a resistance change element connected to a memory cell element to make a pair. Note that an explanation of the same features as in the first embodiment will not be repeated in this embodiment.

[2-1] Structure

Figures 9, 11:
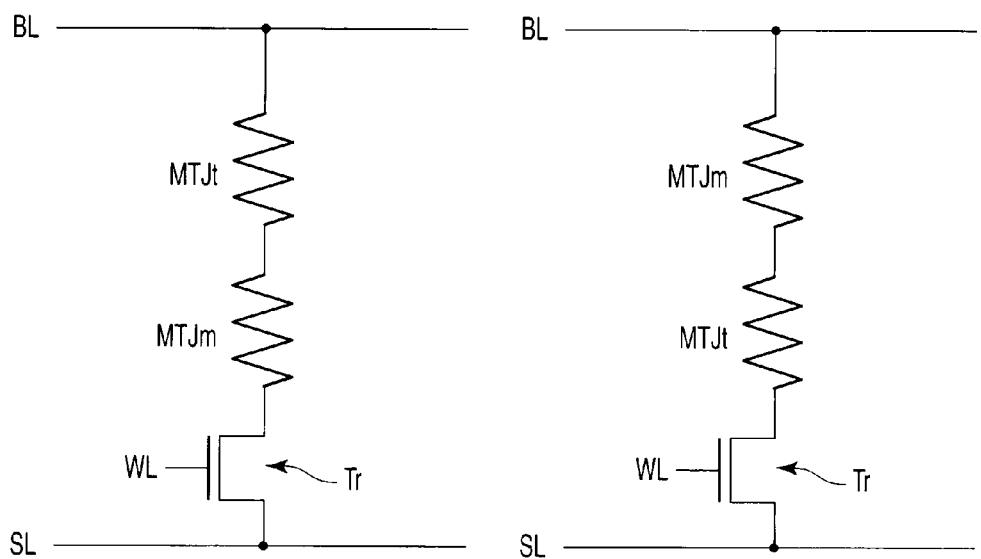
FIG. 9 is a circuit diagram showing a memory cell of a magnetic random access memory according to the second embodiment of the present invention.
FIG. 11 is a circuit diagram showing another memory cell of the magnetic random access memory according to the second embodiment of the present invention.
Figure 10:
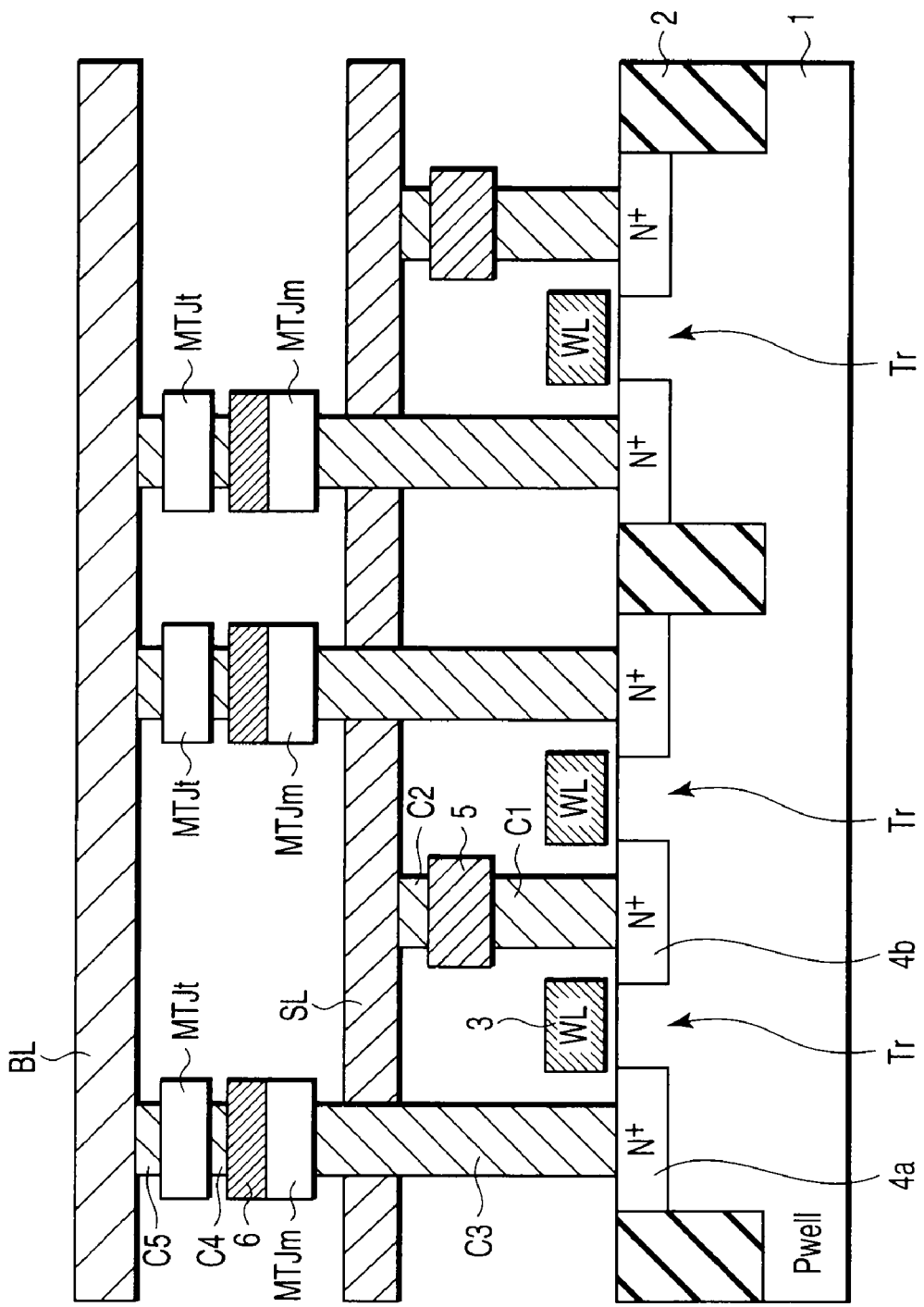
FIG. 10 is a sectional view showing the memory cell of the magnetic random access memory according to the second embodiment of the present invention.

FIGS. 9 and 11 are circuit diagrams of memory cells of a magnetic random access memory according to the second embodiment of the present invention. FIG. 10 is a sectional view of a memory cell of the magnetic random access memory according to the second embodiment of the present invention. The memory cells of the magnetic random access memory according to the second embodiment will be explained below.

As shown in FIGS. 9 and 10, the second embodiment differs from the first embodiment in that an MTJ element MTJt is used as a resistance change element instead of the anti-fuse element AF.

Accordingly, the MTJ element MTJt functioning as a resistance change element is connected to one terminal of an MTJ element MTJm and a bit line BL. The two MTJ elements MTJt and MTJm are connected in series with each other.

Note that the MTJ element MTJt may also be connected to the MTJ element MTJm and a transistor Tr as shown in FIG. 11.

[2-2] MTJ Element

This embodiment uses the MTJ elements as both a memory cell element and resistance change element. The reversing current threshold value of the MTJ element MTJt as a resistance change element is set different from that of the MTJ element MTJm as a memory cell element. This setting can be performed by making any of, e.g., the film thicknesses of recording layers, the materials of the recording layers, the areas of the planar shapes of the recording layers, and the aspect ratios of the planar shapes of the recording layers of the two elements different from each other.

More specifically, the reversing current threshold value of the resistance change element (MTJ element MTJt) can be made higher than that of the memory cell element (MTJ element MTJm) as follows. The film thickness of the recording layer of the resistance change element (MTJ element MTJt) is made larger than that of the recording layer of the memory cell element (MTJ element MTJm). The recording layer of the resistance change element (MTJ element MTJt) is made of a material different from that of the recording layer of the memory cell element (MTJ element MTJm). The area of the planar shape of the recording layer of the resistance change element (MTJ element MTJt) is made smaller than that of the planar shape of the recording layer of the memory cell element (MTJ element MTJm). The aspect ratio of the planar shape of the recording layer of the resistance change element (MTJ element MTJt) is made higher than that of the planar shape of the recording layer of the memory cell element (MTJ element MTJm).

On the other hand, the reversing current threshold value of the resistance change element (MTJ element MTJt) can be made lower than that of the memory cell element (MTJ element MTJm) as follows. The film thickness of the recording layer of the resistance change element (MTJ element MTJt) is made smaller than that of the recording layer of the memory cell element (MTJ element MTJm). The recording layer of the resistance change element (MTJ element MTJt) is made of a material different from that of the recording layer of the memory cell element (MTJ element MTJm). The area of the planar shape of the recording layer of the resistance change element (MTJ element MTJt) is made larger than that of the planar shape of the recording layer of the memory cell element (MTJ element MTJm). The aspect ratio of the planar shape of the recording layer of the resistance change element (MTJ element MTJt) is made lower than that of the planar shape of the recording layer of the memory cell element (MTJ element MTJm).

[2-3] Write Method

Figure 12A:
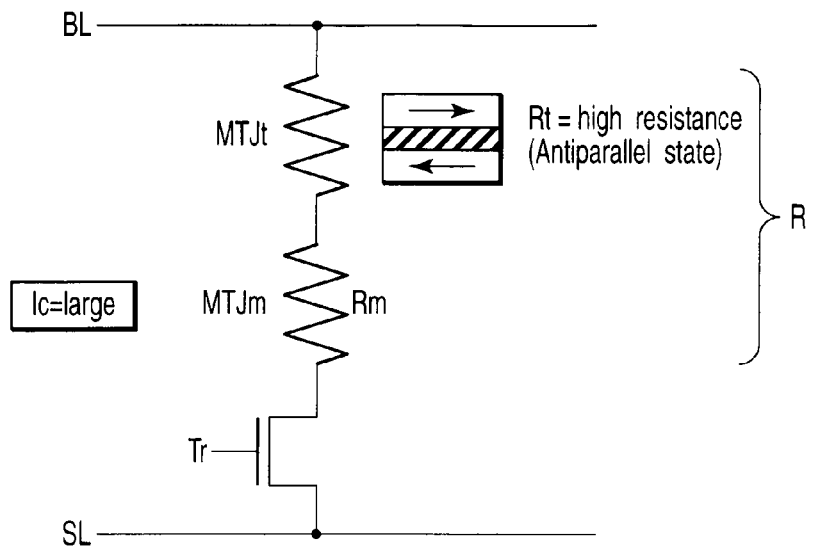
FIGS. 12A and 12B are schematic views for explaining the write method of an MTJ element having a large magnetization reversing current $I_C$ of the magnetic random access memory according to the second embodiment of the present invention.
Figure 12B:
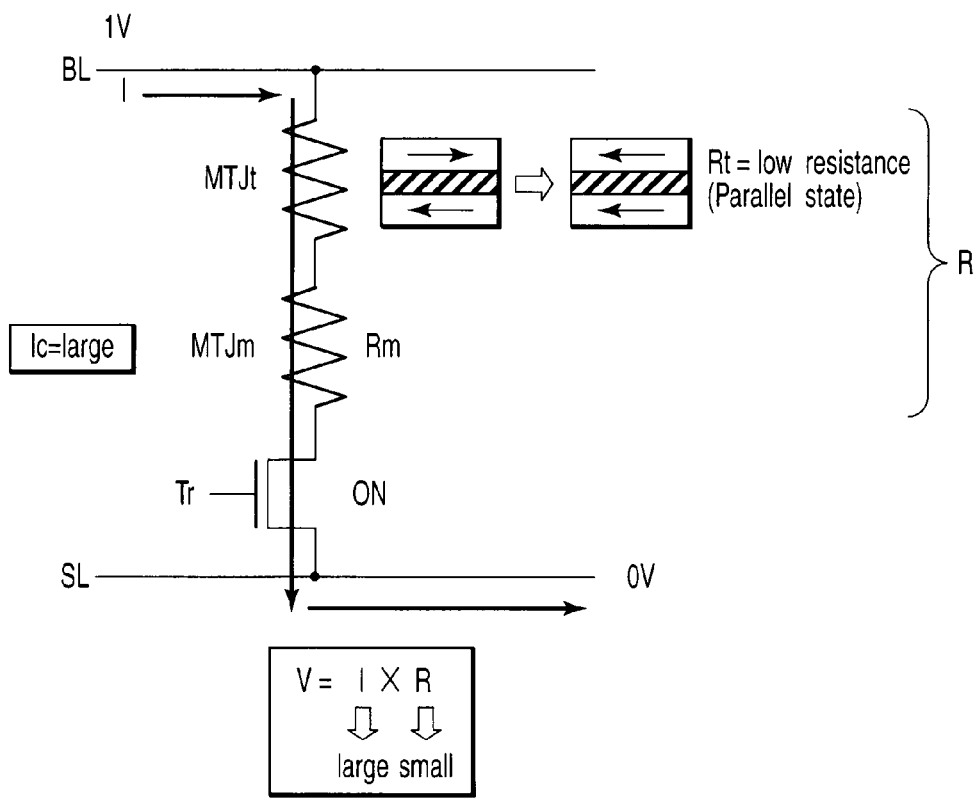
Figure 13A:
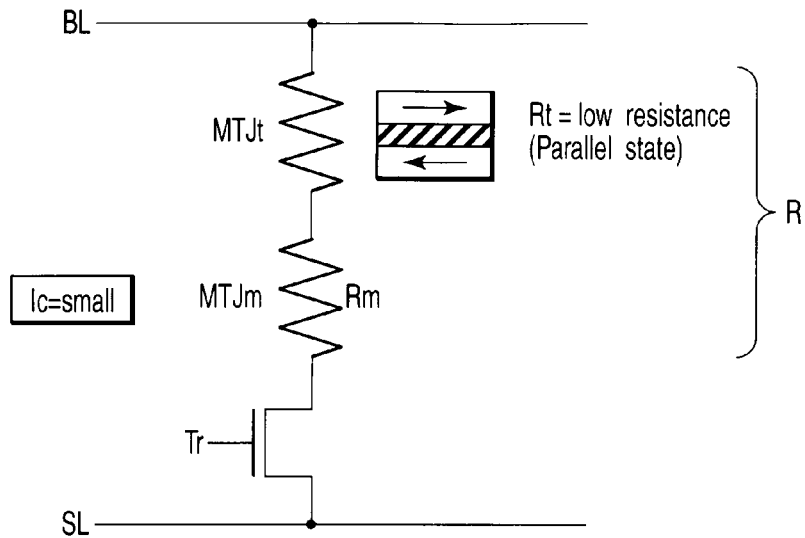
FIGS. 13A and 13B are schematic views for explaining the write method of an MTJ element having a small magnetization reversing current $I_C$ of the magnetic random access memory according to the second embodiment of the present invention.
Figure 13B:
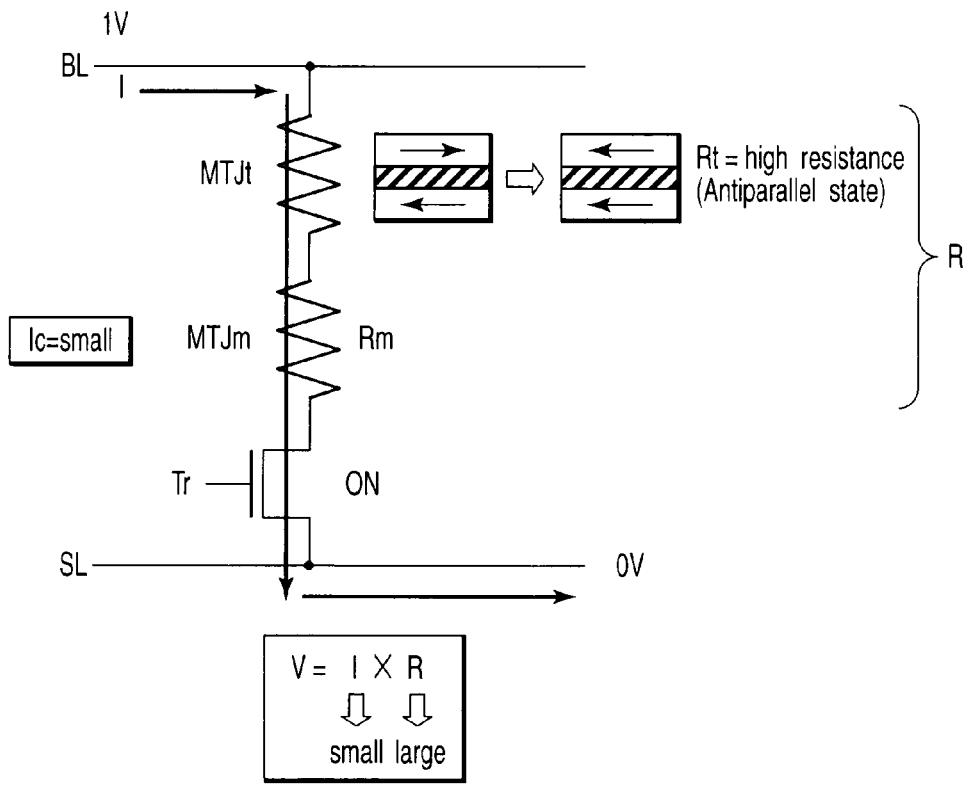
Figure 14:
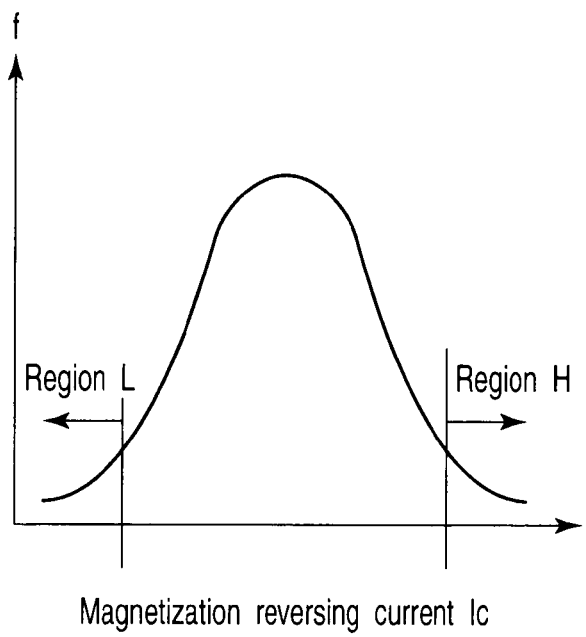
FIG. 14 is a graph showing the waveform of the magnetization reversing current $I_C$ of the MTJ element according to the second embodiment of the present invention.

FIGS. 12A and 12B are schematic views for explaining the write method of an MTJ element having a large magnetization reversing current $I_C$ of the magnetic random access memory according to the second embodiment of the present invention. FIGS. 13A and 13B are schematic views for explaining the write method of an MTJ element having a small magnetization reversing current $I_C$ of the magnetic random access memory according to the second embodiment of the present invention. FIG. 14 is a graph showing the waveform of the magnetization reversing current $I_C$ of the MTJ element according to the second embodiment of the present invention.

(Write Method of MTJ Element Having Large Magnetization Reversing Current $I_C$)

A method of writing data in an MTJ element having a large magnetization reversing current $I_C$ will be explained below.

FIG. 12A shows the initial state. As shown in FIG. 12A, the MTJ elements MTJm and MTJt are connected in series in the memory cell array. The MTJ element MTJm is an element having a large magnetization reversing current $I_C$ (reversing current threshold value) as indicated by a region H in FIG. 14. In the MTJ element MTJm, therefore, the magnetization in the recording layer does not reverse unless a write current increases. On the other hand, the MTJ element MTJt has a reversing current threshold value lower than that of the MTJ element MTJm. The MTJ element MTJt is set in a high-resistance state because the magnetization directions in a fixed layer and the recording layer are antiparallel.

FIG. 12B shows the case where data is read out from a memory cell in the initial state shown in FIG. 12A. When reading out the data, the source line SL is set at 0 V by, e.g., applying a voltage of 1 V to the bit line BL. Then, a write current I is supplied to the MTJ element MTJm to reverse the magnetization in the recording layer.

In this case, the write current I also flows through the MTJ element MTJt. When the electric current I flows through the MTJ element MTJt, the magnetization directions in the fixed layer and recording layer become parallel to set the MTJ element MTJt in a low-resistance state. That is, a resistance value Rt of the MTJ element MTJt decreases from that in the initial state. Accordingly, a resistance value R of the whole cell also decreases. Since the voltage of the circuit is constant and the resistance value R has decreased, therefore, the write current I flowing through the MTJ element MTJm increases in accordance with the relationship of V=I×Rt. Hence, even when the magnetization reversing current $I_C$ of the MTJ element MTJm is large, the magnetization in the recording layer can be reversed because the write current I practically having a large current value flows through the MTJ element MTJm.

As described above, the value of an electric current flowing through the MTJ element MTJm can be increased by changing the magnetization arrangement in the MTJ element MTJt from antiparallel to parallel by the write current I and hence decreasing the resistance value. This makes it possible to cause magnetization reversal in the MTJ element MTJm having a large magnetization reversing current $I_C$ by using a normal write current value.

(Write Method of MTJ Element Having Small Magnetization Reversing Current $I_C$)

A method of writing data in an MTJ element having a small magnetization reversing current $I_C$ will be explained below.

FIG. 13A shows the initial state. As shown in FIG. 13A, the MTJ elements MTJm and MTJt are connected in series in the memory cell array. The MTJ element MTJm is an element having a small magnetization reversing current $I_C$ (reversing current threshold value) as indicated by a region L in FIG. 14. In the MTJ element MTJm, therefore, the magnetization in the recording layer does not reverse unless a write current decreases. On the other hand, the MTJ element MTJt has a reversing current threshold value higher than that of the MTJ element MTJm. The MTJ element MTJt is set in the low-resistance state because the magnetization directions in the fixed layer and recording layer are parallel.

FIG. 13B shows the case where data is read out from a memory cell in the initial state shown in FIG. 13A. When reading out the data, the source line SL is set at 0 V by, e.g., applying a voltage of 1 V to the bit line BL. Then, the write current I is supplied to the MTJ element MTJm to reverse the magnetization in the recording layer.

In this case, the write current I also flows through the MTJ element MTJt. When the electric current I flows through the MTJ element MTJt, the magnetization directions in the fixed layer and recording layer become antiparallel to set the MTJ element MTJt in the high-resistance state. That is, the resistance value Rt of the MTJ element MTJt increases from that in the initial state. Accordingly, the resistance value R of the whole cell also increases. Since the voltage of the circuit is constant and the resistance value R has increased, the write current I flowing through the MTJ element MTJm decreases in accordance with the relationship of V=I×Rt. Hence, even when the magnetization reversing current $I_C$ of the MTJ element MTJm is small, the magnetization in the recording layer can be reversed because the write current I practically having a small current value flows through the MTJ element MTJm.

As described above, the value of an electric current flowing through the MTJ element MTJm can be decreased by changing the magnetization arrangement in the MTJ element MTJt from parallel to antiparallel by the write current I, thereby increasing the resistance value. This makes it possible to cause magnetization reversal in the MTJ element MTJm having a small magnetization reversing current $I_C$ by using a normal write current value.

Note that whether to set the initial state of the MTJ element MTJt to the antiparallel state (high-resistance state) or parallel state (low-resistance state) is determined by the result of check of the reversing current threshold value of the MTJ element MTJm paired with the MTJ element MTJt. That is, an MTJ element MTJt in the antiparallel state (high-resistance state) is formed for an MTJ element MTJm whose reversing current threshold value is larger than a standard value, and an MTJ element MTJt in the parallel state (low-resistance state) is formed for an MTJ element MTJm whose reversing current threshold value is smaller than the standard value.

[2-4] Effects

In the second embodiment described above, an MTJ element MTJt in the antiparallel state (high-resistance state) is set for an MTJ element MTJm having a large reversing current threshold value, and an MTJ element MTJt in the parallel state (low-resistance state) is set for an MTJ element MTJm having a small reversing current threshold value. Even when the reversing current threshold value of the MTJ element MTJm varies, therefore, the resistance changes by magnetization reversal in the MTJ element MTJt when a write current flows, and the value of an electric current flowing through the MTJ element MTJm can be increased or decreased accordingly. Hence, an electric current having a large current value can be supplied to an MTJ element MTJm having a large magnetization reversing current $I_C$, and an electric current having a small current value can be supplied to an MTJ element MTJm having a small magnetization reversing current $I_C$. This makes it possible to improve the write characteristics.

[3] Third Embodiment

The third embodiment is a modification of the second embodiment, and uses two MTJ elements for trimming as resistance change elements. Note that an explanation of the same features as in the first and second embodiments will not be repeated in this embodiment.

[3-1] Structure

Figure 15:
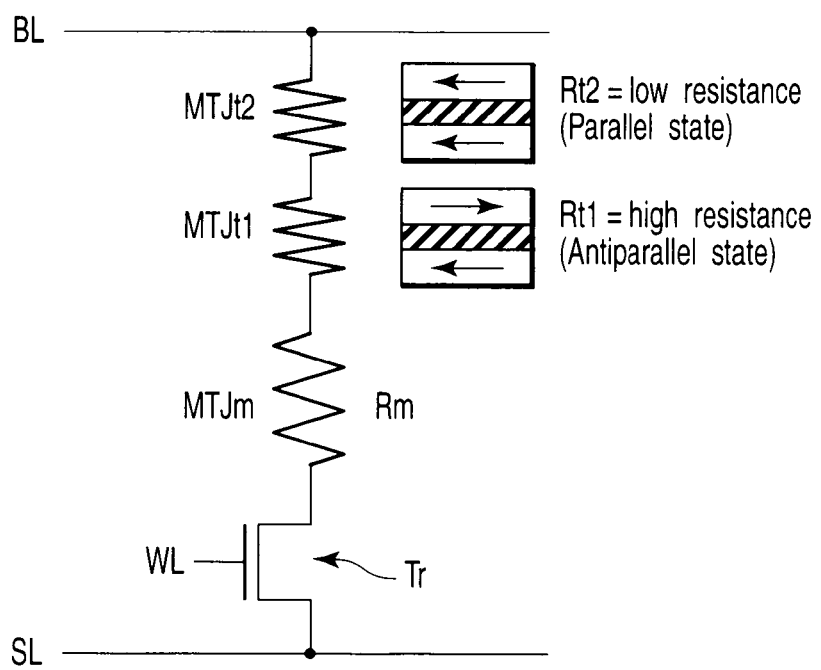
FIG. 15 is a circuit diagram showing a memory cell of a magnetic random access memory according to the third embodiment of the present invention.
Figure 16:
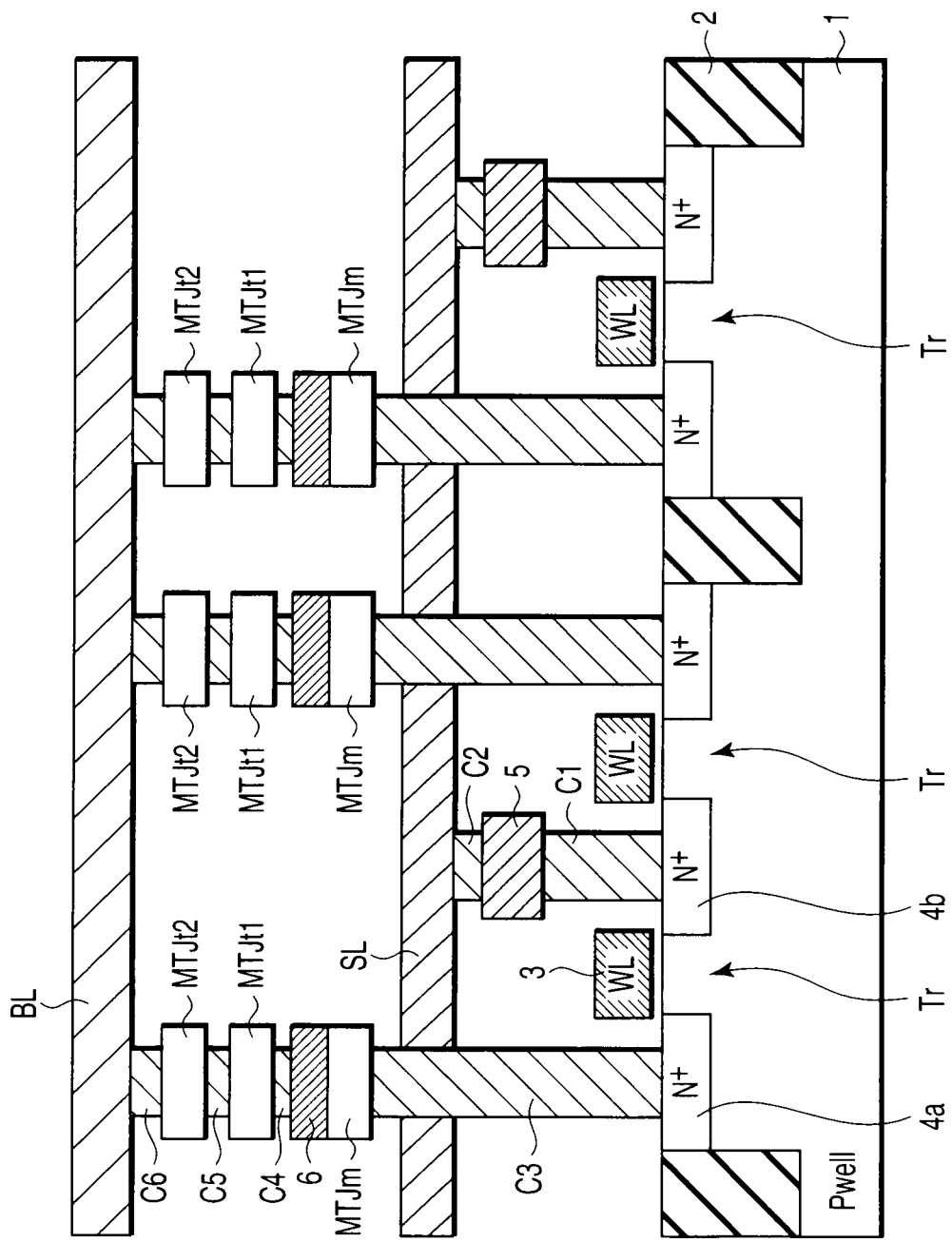
FIG. 16 is a sectional view showing the memory cell of the magnetic random access memory according to the third embodiment of the present invention.

FIGS. 15, 17, and 18 are circuit diagrams of memory cells of a magnetic random access memory according to the third embodiment of the present invention. FIG. 16 is a sectional view of a memory cell of the magnetic random access memory according to the third embodiment of the present invention. The memory cells of the magnetic random access memory according to the third embodiment will be explained below.

As shown in FIGS. 15 and 16, the third embodiment differs from the second embodiment in that two resistance change elements are paired with a memory cell element. These resistance change elements are an MTJ element MTJt1 set in a high-resistance state (antiparallel state), and an MTJ element MTJt2 set in a low-resistance state (parallel state). An MTJ element MTJm, the MTJ element MTJt1, and the MTJ element MTJt2 are connected in series.

The connection order of the three MTJ elements MTJm, MTJt1, and MTJt2 can be variously changed. For example, the three MTJ elements can be connected in the order of SL/Tr/MTJm/MTJt1/MTJt2/BL as shown in FIG. 15, in the order of SL/Tr/MTJt1/MTJt2/MTJm/BL as shown in FIG. 17, or in the order of SL/Tr/MTJt1/MTJm/MTJt2/BL as shown in FIG. 18. Note that it is also possible to set the MTJ element MTJt1 in the low-resistance state (parallel state), and the MTJ element MTJt2 in the high-resistance state (antiparallel state).

In this embodiment as described above, the reversing current threshold value of the MTJ elements MTJt1 and MTJt2 is set different from that of the MTJ element MTJm. A method of setting this reversing current threshold value has been described previously in section [2-2].

[3-2] Write Method

The write method of this embodiment is almost the same as that of the second embodiment. This write method is particularly effective for an MTJ element MTJm having a magnetization reversing current $I_C$ largely different from a standard value.

First, in the fabrication stage, the MTJ element MTJt1 set in the high-resistance state (antiparallel state) and the MTJ element MTJt2 set in the low-resistance state (parallel state) are formed. The MTJ elements MTJt1 and MTJt2 are connected in series with the MTJ element MTJm as a memory cell element.

Then, the variation in magnetization reversing current $I_C$ of the MTJ element MTJm is checked. In accordance with the magnitude of the magnetization reversing current $I_C$ of the MTJ element MTJm, the magnetization arrangements in the two MTJ elements MTJt1 and MTJt2 are set in the antiparallel state (high-resistance state) or parallel state (low-resistance state).

That is, if the magnetization reversing current $I_C$ of the MTJ element MTJm is much larger than a standard, both the magnetization arrangements in the corresponding MTJ elements MTJt1 and MTJt2 are set in the antiparallel state, thereby increasing a total resistance value (Rt1+Rt2). That is, the magnetization in the MTJ element MTJt2 set in the low-resistance state (parallel state) in the fabrication stage is changed to the antiparallel state.

On the other hand, if the magnetization reversing current $I_C$ of the MTJ element MTJm is much smaller than the standard, both the magnetization arrangements in the corresponding MTJ elements MTJt1 and MTJt2 are set in the parallel state, thereby decreasing the total resistance value (Rt1+Rt2). That is, the magnetization in the MTJ element MTJt1 set in the high-resistance state (antiparallel state) in the fabrication stage is changed to the parallel state.

Under the above-mentioned setting, the write operation is performed on the basis of the same principles as in the second embodiment.

When an electric current I flows through the two MTJ elements MTJt1 and MTJt2 in the antiparallel state in order to write data in an MTJ element MTJm having a large magnetization reversing current $I_C$, the MTJ elements MTJt1 and MTJt2 are rewritten into the parallel magnetization arrangement, and set in the low-resistance state. That is, resistance values Rt1 and Rt2 of the MTJ elements MTJt1 and MTJt2 decrease from those in the initial state. Consequently, a total resistance Rt (Rt: Rt1+Rt2) of the MTJ elements MTJt1 and MTJt2 largely decreases, and a resistance value R of the whole cell also largely decreases. Since the voltage of the circuit is constant and the resistance value R has decreased, therefore, the writhe current I flowing through the MTJ element MTJm increases in accordance with the relationship of V=I×R. Accordingly, even when the magnetization reversing current $I_C$ of the MTJ element MTJm is large, the magnetization in the recording layer can be reversed because the write current I practically having a large current value flows through the MTJ element MTJm.

When the electric current I flows through the two MTJ elements MTJt1 and MTJt2 in the parallel state in order to write data in an MTJ element MTJm having a small magnetization reversing current $I_C$, the MTJ elements MTJt1 and MTJt2 are rewritten into the antiparallel magnetization arrangement, and set in the high-resistance state. That is, the resistance values Rt1 and Rt2 of the MTJ elements MTJt1 and MTJt2 increase from those in the initial state. Consequently, the total resistance Rt (Rt: Rt1+Rt2) of the MTJ elements MTJt1 and MTJt2 largely increases, and the resistance value R of the whole cell also largely increases. Since the voltage of the circuit is constant and the resistance value R has increased, therefore, the writhe current I flowing through the MTJ element MTJm decreases in accordance with the relationship of V=I×R. Accordingly, even when the magnetization reversing current $I_C$ of the MTJ element MTJm is small, the magnetization in the recording layer can be reversed because the write current I practically having a small current value flows through the MTJ element MTJm.

[3-3] Effects

The third embodiment described above can achieve the same effect as in the second embodiment. In addition, the third embodiment uses the two MTJ elements MTJt1 and MTJt2 for trimming as resistance change elements. Before a write operation, the magnetization directions in the two MTJ elements MTJt1 and MTJt2 are set in the antiparallel state (high-resistance state) or parallel state (low-resistance state) in accordance with the variation in magnetization reversing current $I_C$ of the MTJ element MTJm. Therefore, it is possible to largely change the value of an electric current flowing through an MTJ element MTJm having the magnetization reversing current $I_C$ largely different from a standard, by changing the resistances of the two corresponding MTJ elements MTJt1 and MTJt2. This makes it possible to apparently reduce the variation in magnetization reversing current in the cell array, and improve the write characteristics.

[4] Fourth Embodiment

The fourth embodiment is a modification of the second embodiment, in which a memory cell element and resistance change element are connected in parallel. Note that an explanation of the same features as in the first and second embodiments will not be repeated in this embodiment.

[4-1] Structure

FIG. 19 is a circuit diagram of a memory cell of a magnetic random access memory according to the fourth embodiment of the present invention. FIG. 20 is a sectional view of the memory cell of the magnetic random access memory according to the fourth embodiment of the present invention. The memory cell of the magnetic random access memory according to the fourth embodiment will be explained below.

As shown in FIGS. 19 and 20, the fourth embodiment differs from the second embodiment in that an MTJ element MTJt as a resistance change element is connected in parallel to an MTJ element MTJm as a memory cell element.

As in the second embodiment, the reversing current threshold value of the MTJ element MTJt as a resistance change element is set different from that of the MTJ element MTJm as a memory cell element. As described earlier in section [2-2], this setting can be performed by making any of, e.g., the film thicknesses of recording layers, the materials of the recording layers, the areas of the planar shapes of the recording layers, and the aspect ratios of the planar shapes of the recording layers of the two MTJ elements different from each other. When the two MTJ elements MTJm and MTJt are formed in the same plane as shown in FIG. 20, however, the process is facilitated by making the areas or aspect ratios of the planar shapes of the recording layers of the two MTJ elements different from each other, rather than by making the film thicknesses or materials of the recording layers of the two MTJ elements different from each other.

[4-2] Effects

The fourth embodiment can achieve the same effect as in the second embodiment. In addition, the MTJ elements MTJt and MTJm are connected in parallel in the fourth embodiment. Therefore, the change in resistance value R of the whole cell is smaller than that in the second embodiment in which the MTJ elements MTJt and MTJm are connected in series. However, the MTJ elements MTJt and MTJm can be formed in the same plane, facilitating the process.

[5] Fifth Embodiment

The fifth embodiment is a modification of the third embodiment, in which two resistance change elements are formed in the end portion of a memory cell array. Note that an explanation of the same features as in the first to fourth embodiments will not be repeated in this embodiment.

[5-1] Structure

Figure 21:
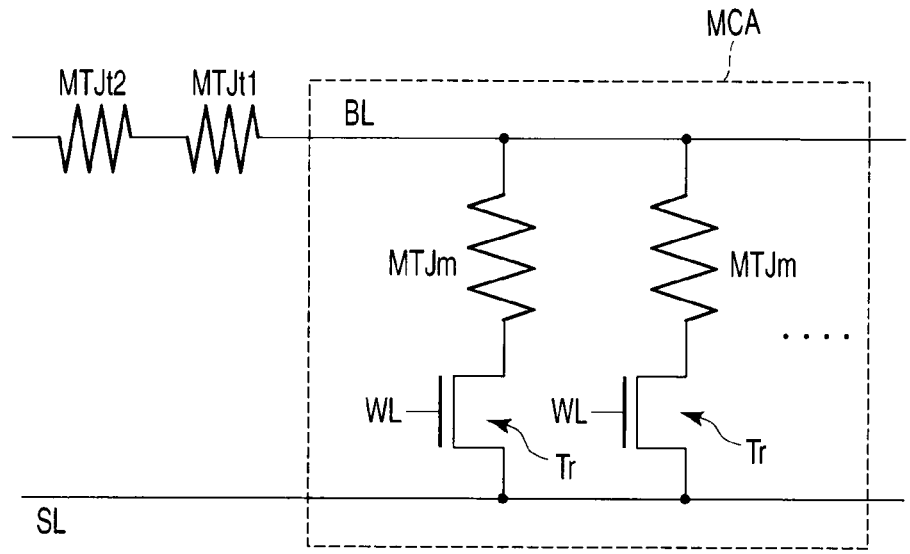
FIG. 21 is a circuit diagram showing a memory cell of a magnetic random access memory according to the fifth embodiment of the present invention.
Figure 23:
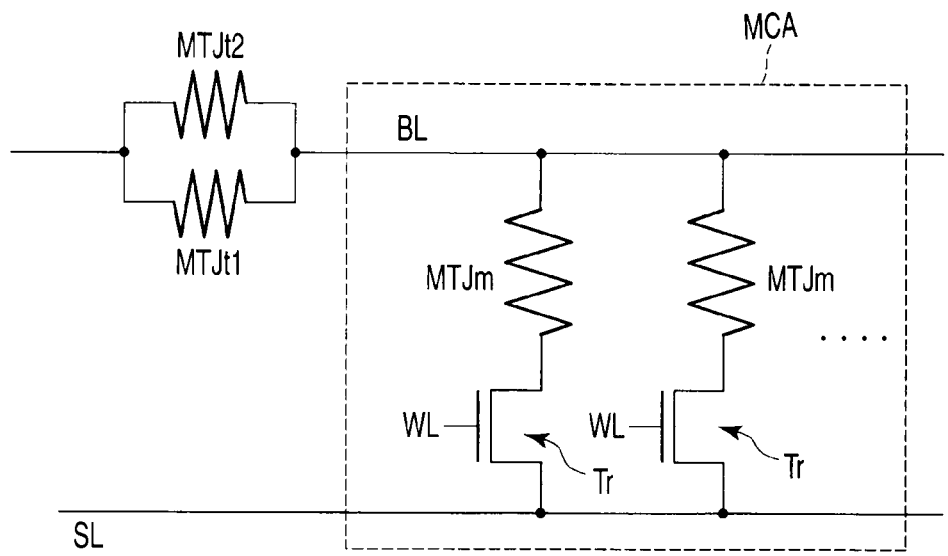
FIG. 23 is a circuit diagram showing another memory cell of the magnetic random access memory according to the fifth embodiment of the present invention.
Figure 22:
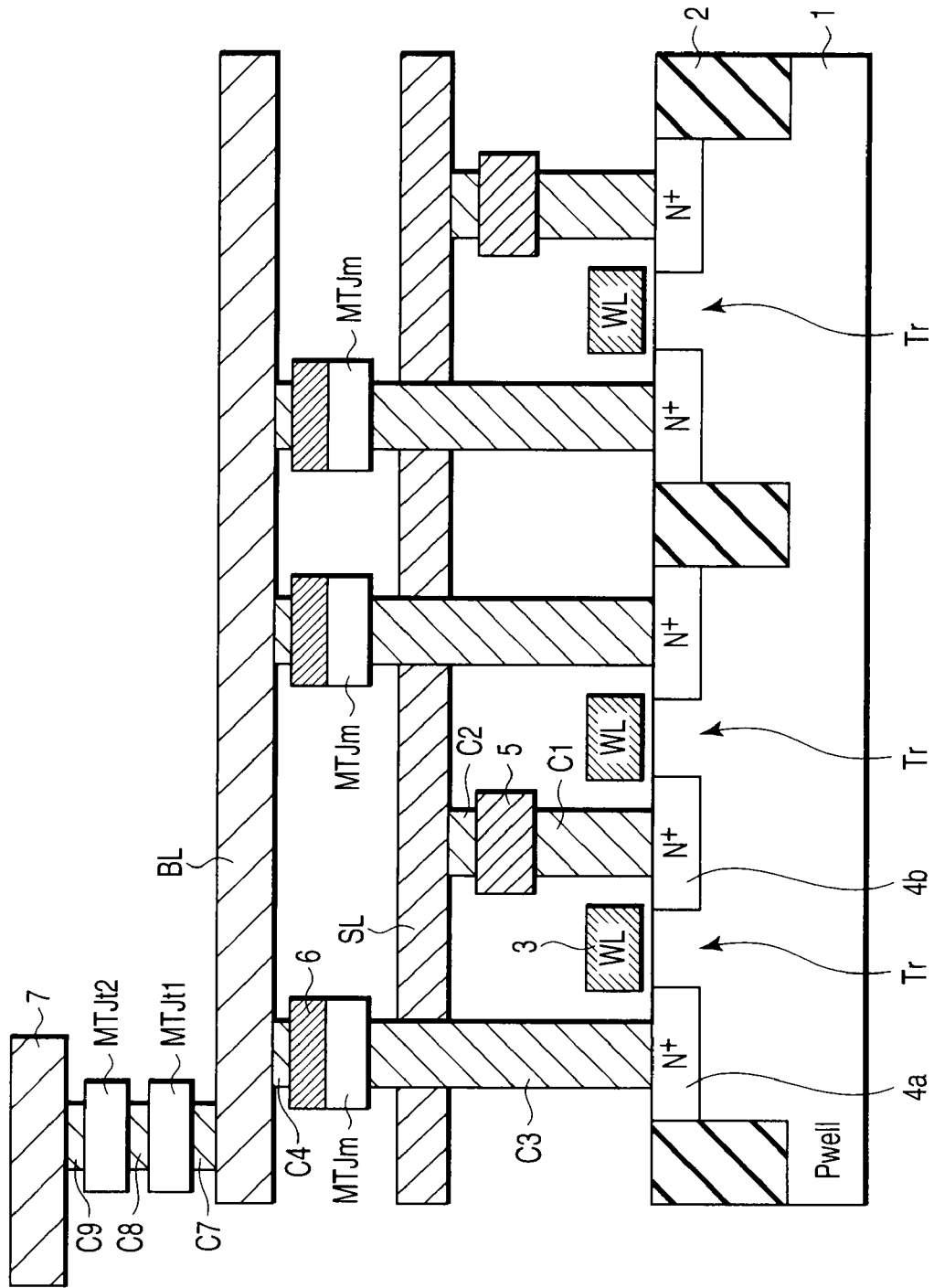
FIG. 22 is a sectional view showing the memory cell of the magnetic random access memory according to the fifth embodiment of the present invention.

FIGS. 21 and 23 are circuit diagrams showing memory cells of a magnetic random access memory according to the fifth embodiment of the present invention. FIG. 22 is a sectional view of a memory cell of the magnetic random access memory according to the fifth embodiment of the present invention. The memory cells of the magnetic random access memory according to the fifth embodiment will be explained below.

As shown in FIGS. 21 and 22, the fifth embodiment differs from the third embodiment in that MTJ elements MTJt for trimming are formed for each bit line in the end portion of a memory cell array MCA.

More specifically, an MTJ element MTJt1 set in a high-resistance state (antiparallel state) and an MTJ element MTJt2 set in a low-resistance state (parallel state) are connected to a bit line BL to which a plurality of memory cells are connected. The MTJ elements MTJt1 and MTJt2 are connected in series with each other, and arranged in the end portion of the memory cell array MCA.

Note that as shown in FIG. 23, the MTJ elements MTJt1 and MTJt2 may also be connected in parallel to each other. It is also possible to use only one MTJ element MTJt for trimming or three or more MTJ elements MTJ for trimming.

[5-2] Effects

The fifth embodiment described above can achieve the same effects as in the third embodiments. In addition, the MTJ elements MTJt1 and MTJt2 for trimming are formed for each bit line BL in the fifth embodiment. Therefore, the cell area can be reduced compared to the case where the MTJ elements MTJt1 and MTJt2 for trimming are formed for each MTJ element MTJm.

[6] Sixth Embodiment

In the sixth embodiment, MTJ elements for trimming are connected to memory cells having a chain structure. Note that an explanation of the same features as in the first and second embodiments will not be repeated in this embodiment.

[6-1] Structure

Figure 24:
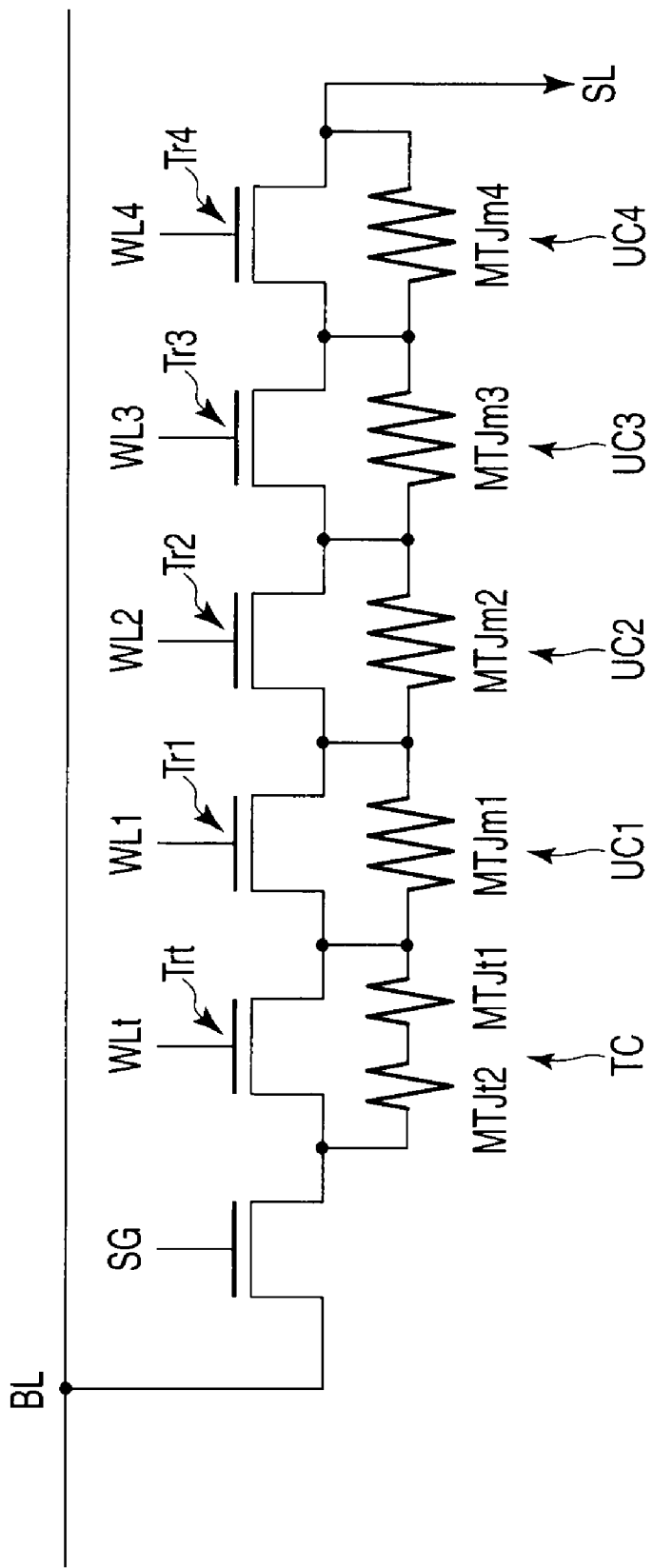
FIG. 24 is a circuit diagram showing memory cells of a magnetic random access memory according to the sixth embodiment of the present invention.
Figure 25:
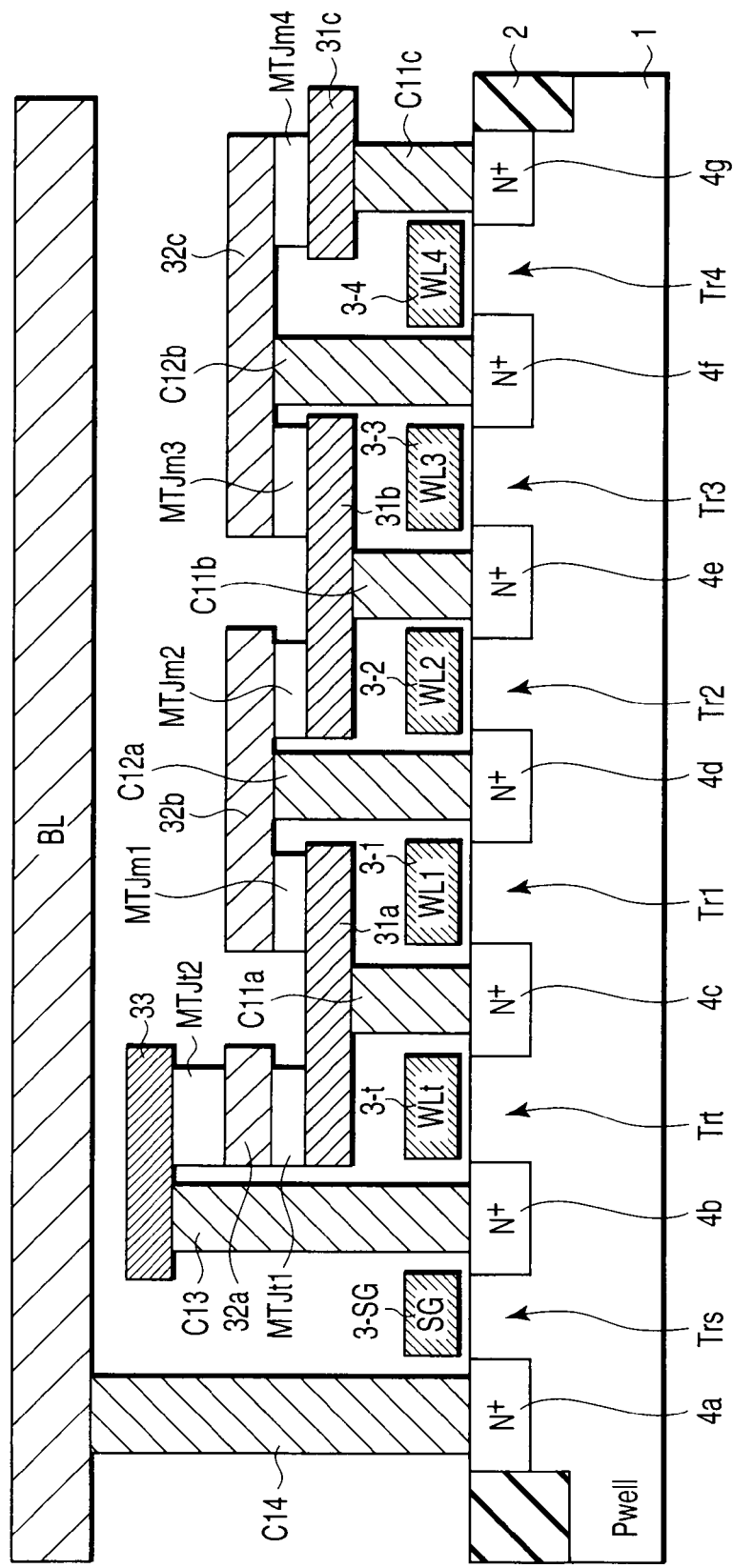
FIG. 25 is a sectional view showing the memory cells of the magnetic random access memory according to the sixth embodiment of the present invention.

FIG. 24 is a circuit diagram of memory cells of a magnetic random access memory according to the sixth embodiment of the present invention. FIG. 25 is a sectional view of the memory cells of the magnetic random access memory according to the sixth embodiment of the present invention. The memory cells of the magnetic random access memory according to the sixth embodiment will be explained below.

As shown in FIGS. 24 and 25, the sixth embodiment differs from the second embodiment in that memory cells have a chain structure, and MTJ elements MTJt1 and MTJt2 for trimming are connected to this chain structure.

More specifically, the two terminals of an MTJ element MTJm1 are connected to source/drain diffusion layers 4c and 4d of a transistor Tr1, thereby forming a unit cell UC1. Similarly, the two terminals of an MTJ element MTJm2 are connected to the source/drain diffusion layer 4d and a source/drain diffusion layer 4e of a transistor Tr2, thereby forming a unit cell UC2. The two terminals of an MTJ element MTJm3 are connected to the source/drain diffusion layer 4e and a source/drain diffusion layer 4f of a transistor Tr3, thereby forming a unit cell UC3. The two terminals of an MTJ element MTJm4 are connected to the source/drain diffusion layer 4f and a source/drain diffusion layer 4g of a transistor Tr4, thereby forming a unit cell UC4. The unit cells UC1, UC2, UC3, and UC4 are connected in series by sharing the source/drain diffusion layers by adjacent cells.

A trimming cell TC is connected in series with these memory cells having the chain structure as described above by sharing the source/drain diffusion layer 4c of the unit cell UC1. The trimming cell TC comprises the series-connected MTJ elements MTJt1 and MTJt2 for trimming, and a transistor Trt. The two terminals of the series-connected MTJ elements MTJt1 and MTJt2 are connected to a source/drain diffusion layer 4b and the source/drain diffusion layer 4c of the transistor Trt.

A selection gate transistor Trs is connected to the memory cells having the chain structure and the trimming cell TC. A bit line BL is connected to a source/drain diffusion layer 4a of the selection gate transistor Trs via a contact C14.

[6-2] Effect

The sixth embodiment described above can achieve the same effect as in the second embodiment.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A magnetic random access memory comprising:
a memory cell element which includes a first fixed layer in which a magnetization direction is fixed, a first recording layer in which a magnetization direction reverses on the basis of a first threshold value, and a first nonmagnetic layer formed between the first fixed layer and the first recording layer, and in which the magnetization directions in the first fixed layer and the first recording layer take one of a parallel state and an antiparallel state in accordance with a direction of an electric current flowing between the first fixed layer and the first recording layer;
a first interconnection connected to one terminal of the memory cell element;
a transistor whose current path has one end connected to the other terminal of the memory cell element;
a second interconnection connected to the other end of the current path; and
a first resistance change element electrically connected to the memory cell element, and having a resistance value which changes on the basis of a second threshold value different from the first threshold value.

2. The memory according to claim 1, wherein the first resistance change element comprises an anti-fuse element.

3. The memory according to claim 2, wherein the second threshold value is an electrostatic breakdown voltage value lower than the first threshold value.

4. The memory according to claim 2, wherein the anti-fuse element comprises a capacitor element having a first conductive layer, a second conductive layer, and an insulating layer formed between the first conductive layer and the second conductive layer.

5. The memory according to claim 1, wherein
the first resistance change element includes a second fixed layer in which a magnetization direction is fixed, a second recording layer in which a magnetization direction reverses on the basis of the second threshold value, and a second nonmagnetic layer formed between the second fixed layer and the second recording layer, and the magnetization directions in the second fixed layer and the second recording layer take one of the parallel state and the antiparallel state in accordance with a direction of an electric current flowing between the second fixed layer and the second recording layer, and
the memory cell element and the first resistance change element are connected in series.

6. The memory according to claim 5, wherein a film thickness of the second recording layer differs from that of the first recording layer.

7. The memory according to claim 5, wherein a material of the second recording layer differs from that of the first recording layer.

8. The memory according to claim 5, wherein an area of a planar shape of the second recording layer differs from that of a planar shape of the first recording layer.

9. The memory according to claim 5, wherein an aspect ratio of a planar shape of the second recording layer differs from that of a planar shape of the first recording layer.

10. The memory according to claim 1, which further comprises a second resistance change element electrically connected to the memory cell element, and having a resistance value which changes on the basis of a third threshold value different from the first threshold value, and in which the first resistance change element includes a second fixed layer in which a magnetization direction is fixed, a second recording layer in which a magnetization direction reverses on the basis of the second threshold value, and a second nonmagnetic layer formed between the second fixed layer and the second recording layer, and the magnetization directions in the second fixed layer and the second recording layer take one of the parallel state and the antiparallel state in accordance with a direction of an electric current flowing between the second fixed layer and the second recording layer, the second resistance change element includes a third fixed layer in which a magnetization direction is fixed, a third recording layer in which a magnetization direction reverses on the basis of the third threshold value, and a third nonmagnetic layer formed between the third fixed layer and the third recording layer, and the magnetization directions in the third fixed layer and the third recording layer take one of the parallel state and the antiparallel state in accordance with a direction of an electric current flowing between the third fixed layer and the third recording layer, the memory cell element, the first resistance change element, and the second resistance change element are connected in series, and the first resistance change element is set in the antiparallel state, and the second resistance change element is set in the parallel state.

11. The memory according to claim 10, wherein the first resistance change element and the second resistance change element are connected between one terminal of the memory cell element and the first interconnection.

12. The memory according to claim 10, wherein the first resistance change element and the second resistance change element are connected between the other terminal of the memory cell element and one end of the current path of the transistor.

13. The memory according to claim 10, wherein the memory cell element is connected between the first resistance change element and the second resistance change element.

14. The memory according to claim 1, wherein
the first resistance change element includes a second fixed layer in which a magnetization direction is fixed, a second recording layer in which a magnetization direction reverses on the basis of the second threshold value, and a second nonmagnetic layer formed between the second fixed layer and the second recording layer, and the magnetization directions in the second fixed layer and the second recording layer take one of the parallel state and the antiparallel state in accordance with a direction of an electric current flowing between the second fixed layer and the second recording layer, and
the memory cell element and the first resistance change element are connected in parallel.

15. The memory according to claim 1, wherein the first resistance change element is connected to the first interconnection in an end portion of a memory cell array including the memory cell element.

16. A write method of a magnetic random access memory comprising:
a memory cell element which includes a first fixed layer in which a magnetization direction is fixed, a first recording layer in which a magnetization direction reverses on the basis of a first threshold value, and a first nonmagnetic layer formed between the first fixed layer and the first recording layer, and in which the magnetization directions in the first fixed layer and the first recording layer take one of a parallel state and an antiparallel state in accordance with a direction of an electric current flowing between the first fixed layer and the first recording layer;

a first interconnection connected to one terminal of the memory cell element;

a transistor whose current path has one end connected to the other terminal of the memory cell element;

a second interconnection connected to the other end of the current path; and a first resistance change element electrically connected to the memory cell element, and having a resistance value which changes on the basis of a second threshold value different from the first threshold value, wherein when writing data in the memory cell element by supplying a write current perpendicularly to a film surface of the memory cell element, a value of an electric current flowing through the memory cell element is changed by changing the resistance value of the first resistance change element by the write current, supplying an electric current exceeding the first threshold value to the memory cell element.

17. The method according to claim 16, wherein
the first resistance change element comprises an anti-fuse element,
the second threshold value is an electrostatic breakdown voltage value lower than the first threshold value, and
the value of the electric current flowing through the memory cell element is increased by decreasing the resistance value of the anti-fuse element by the write current.

18. The method according to claim 16, wherein
the first resistance change element includes a second fixed layer in which a magnetization direction is fixed, a second recording layer in which a magnetization direction reverses on the basis of the second threshold value, and a second nonmagnetic layer formed between the second fixed layer and the second recording layer, and the magnetization directions in the second fixed layer and the second recording layer take one of the parallel state and the antiparallel state in accordance with a direction of an electric current flowing between the second fixed layer and the second recording layer, and
the resistance value of the first resistance change element is changed by changing the first resistance change element to one of the parallel state and the antiparallel state by the write current, thereby changing the value of the electric current flowing through the memory cell element.

19. The method according to claim 18, wherein the memory cell element and the first resistance change element form one of a series circuit and a parallel circuit.

20. The method according to claim 16, wherein
the magnetic random access memory further comprises a second resistance change element electrically connected to the memory cell element, and having a resistance value which changes on the basis of a third threshold value different from the first threshold value,
the first resistance change element includes a second fixed layer in which a magnetization direction is fixed, a second recording layer in which a magnetization direction reverses on the basis of the second threshold value, and a second nonmagnetic layer formed between the second fixed layer and the second recording layer, and the magnetization directions in the second fixed layer and the second recording layer take one of the parallel state and the antiparallel state in accordance with a direction of an electric current flowing between the second fixed layer and the second recording layer,
the second resistance change element includes a third fixed layer in which a magnetization direction is fixed, a third recording layer in which a magnetization direction reverses on the basis of the third threshold value, and a third nonmagnetic layer formed between the third fixed layer and the third recording layer, and the magnetization directions in the third fixed layer and the third recording layer take one of the parallel state and the antiparallel state in accordance with a direction of an electric current flowing between the third fixed layer and the third recording layer,
the first resistance change element is set in the antiparallel state, and the second resistance change element is set in the parallel state, and
a total resistance value of the first resistance change element and the second resistance change element is changed by setting the first resistance change element and the second resistance change element in one of the parallel state and the antiparallel state by the write current, changing the value of the electric current flowing through the memory cell element.

* * * * *